United States Patent
Noh et al.

(10) Patent No.: US 9,689,072 B2
(45) Date of Patent: Jun. 27, 2017

(54) METHOD OF DEPOSITING THIN FILM

(71) Applicant: ASM IP Holding B.V., Almere (NL)

(72) Inventors: Hyung Wook Noh, Anyang (KR);
Seung Woo Choi, Cheonan (KR);
Dong Seok Kang, Cheonan (KR)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/840,117

(22) Filed: Aug. 31, 2015

(65) Prior Publication Data

US 2016/0060754 A1     Mar. 3, 2016

(30) Foreign Application Priority Data

Sep. 1, 2014  (KR) .................. 10-2014-0115654
Aug. 31, 2015 (KR) .................. 10-2015-0122889

(51) Int. Cl.
    C23C 16/26     (2006.01)
    C23C 16/455    (2006.01)
    G02B 1/111     (2015.01)
    C23C 16/44     (2006.01)
    C23C 16/50     (2006.01)

(52) U.S. Cl.
    CPC ........ C23C 16/26 (2013.01); C23C 16/45536
    (2013.01); C23C 16/45542 (2013.01); **C23C
    16/45553 (2013.01); G02B 1/111** (2013.01);
    C23C 16/4408 (2013.01); C23C 16/45523
    (2013.01); C23C 16/45525 (2013.01); C23C
    16/50 (2013.01)

(58) Field of Classification Search
    CPC .............. C23C 16/45542; C23C 16/26; C23C
    16/45553; C23C 16/4408; C23C
    16/45523; C23C 16/45525; C23C 16/50;
    C23C 16/45536; G02B 1/111
    USPC ........................................................ 427/569
    See application file for complete search history.

(56) References Cited

U.S. PATENT DOCUMENTS 6,852,474 B2   2/2005  Sabnis
7,132,219 B2  11/2006  Sabnis
(Continued)

OTHER PUBLICATIONS

Loscutoff, P.W., Zhou, H., Clendenning, S.B., Bent, S.F., "Formation of Organic Nanoscale Laminates and Blends by Molecular Layer Deposition", 2009, ACS Nano, 4, p. 331-341.*
(Continued)

*Primary Examiner* — Katherine A Bareford
*Assistant Examiner* — Christina McClure
(74) *Attorney, Agent, or Firm* — Lex IP Meister, PLLC

(57) ABSTRACT

A method of depositing a thin film includes: supplying a first source gas to a reactor during a first time period; supplying a purge gas to the reactor during a second time period; supplying a second source gas to the reactor during a third time period; and supplying the purge gas to the reactor during a fourth time period, wherein the first source gas and the second source gas comprise polymer precursors, and wherein the first source gas and the second source gas are supplied at a temperature that is less than 100° C. or about 100° C. According to the method, uniformity and step coverage of a thin film can be improved by depositing an amorphous carbon layer using polymer precursors according to an Atomic layer deposition (ALD) method.

7 Claims, 6 Drawing Sheets

(56) References Cited

U.S. PATENT DOCUMENTS

2002/0132190 A1    9/2002  Brewer
2008/0254231 A1*  10/2008  Lin ..................... C23C 16/403
                                                        427/576

OTHER PUBLICATIONS

Usui, H., "Deposition of Polymeric Thin Films by Ionization-Assisted Method", 1998, p. 577-582.*

* cited by examiner

FIG. 5

| Wavelength | Check item | Experimental data | Criteria |
|---|---|---|---|
| 248nm (non-visible light) | n (refractive index) | 1.72 | >0.1 |
| 633nm (visible light) | k (absorption coefficient) | 0.005 | <0.1 |

METHOD OF DEPOSITING THIN FILM

CROSS-REFERENCES TO RELATED APPLICATION

This application claims priority to and the benefit of Korean Patent Application No. 10-2014-0115654 filed in the Korean Intellectual Property Office on Sep. 1, 2014 and Korean Patent Application No. 10-2015-0122889 filed in the Korean Intellectual Property Office on Aug. 31, 2015, the entire contents of which are incorporated herein by reference.

BACKGROUND (a) Field of the Invention

The described technology relates generally to a method of depositing a thin film.

(b) Description of the Related Art

Atomic layer deposition (ALD) is a deposition process of a self-limiting method. In this process, in a step structure having a high aspect ratio on a semiconductor substrate, excellent step coverage can be achieved and a thin film with a specific thickness can be deposited through precise control.

An inorganic precursor is usually used in the ALD process. Recently, researches have been carried out on ALD using an organic precursor or a polymer precursor. Particularly, a polymer precursor including carbon may be used to deposit an amorphous carbon layer for an anti-reflective layer (ARL) in a semiconductor photo-process.

U.S. Pat. Nos. 6,852,474 and 7,132,219 and U.S. Patent Application Publication No. 2002/0132190 disclose methods of depositing ARL using polymer precursors. They disclose the results of a plasma-enhanced chemical vapor deposition (PECVD) process or a chemical vapor deposition (CVD) process.

The PECVD or CVD process is advantageous in terms of productivity improvement because it has a fast film-forming rate, but precise control of a thin film, such as uniformity and excellent step coverage of a thin film, is required in terms of characteristics of semiconductor devices that are gradually becoming better.

The above information disclosed in this Background section is only for enhancement of understanding of the background of the described technology and therefore it may contain information that does not form the prior art that is already known in this industry to a person of ordinary skill in the art.

SUMMARY

The described technology has been made in an effort to provide a method of depositing a thin film having an advantage of improving uniformity and step coverage of a thin film by depositing an amorphous carbon layer using polymer precursors.

An exemplary embodiment provides a method of depositing a thin film, including supplying a first source gas to a reactor during a first time, supplying a purge gas to the reactor during a second time, supplying a second source gas to the reactor during a third time, and supplying the purge gas to the reactor for a fourth time, wherein the first source gas and the second source gas include polymer precursors.

The first source gas may include ethylenediamine ($C_2H_4$ ($NH_2$)$_2$), and the second source gas may include 1,4-phenylene diisocyanate ($C_6H_2(CNO)_2$).

The purge gas may continue to be supplied during the first time to the fourth time.

A first gas supply cycle including the first time to the fourth time may be repeated several times.

Plasma may be simultaneously supplied in at least part of the first time and the third time.

Each of the second time and the fourth time may be longer than each of the first time and the third time.

A second gas supply cycle including the first time and the second time may be repeated several times, and a third gas supply cycle including the third time and the fourth time may be repeated several times.

The first source gas and the second source gas may include any one selected from the group consisting of hexamethylene diamine ($C_6H_{16}N_2$), ethylenediamine ($C_2H_4$ ($NH_2$)$_2$), 1,6-diisocyanatohexane ($C_8H_{12}N_2O_2$), and 1,4-phenylene diisocyanate ($C_6H_2(CNO)_2$). In accordance with the method of depositing a thin film according to an exemplary embodiment, the uniformity and step coverage of a thin film can be improved by depositing an amorphous carbon layer using a polymer precursor through an ALD method.

BRIEF DESCRIPTION OF THE DRAWINGS

FIG. 5 is a diagram illustrating the results of an experimental example.

DETAILED DESCRIPTION

Figure 1:
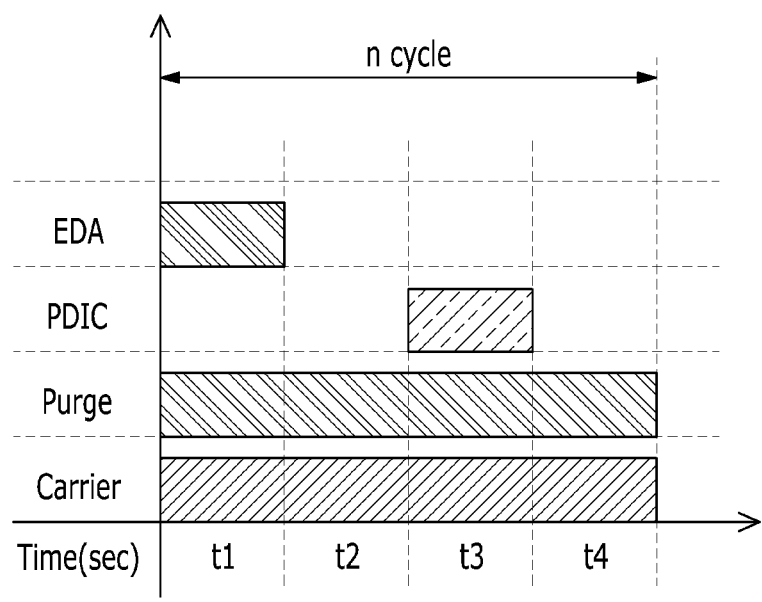
FIG. 1 is a diagram illustrating a gas supply cycle according to a method of depositing a thin film in accordance with an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc. are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A method of depositing a thin film in accordance with an exemplary embodiment is described below with reference to the accompanying drawings.

First, a method of depositing a thin film in accordance with an exemplary embodiment is described with reference to FIG. 1. FIG. 1 is a diagram illustrating a gas supply cycle according to a method of depositing a thin film in accordance with an exemplary embodiment.

Referring to FIG. 1, in the method of depositing a thin film in accordance with the present exemplary embodiment, a thin film is deposited by alternately supplying a polymer precursor of ethylenediamine (EDA; $C_2H_4(NH_2)_2$) and a polymer precursor of 1,4-phenylene diisocyanate (PDIC; $C_6H_2(CNO)_2$) to a reactor.

The two polymer precursors form polyurea through a reaction on a substrate.

More specifically, during a first time period t1, the polymer precursor of ethylenediamine (EDA; $C_2H_4(NH_2)_2$), that is, a first source gas, is supplied while a purge gas and a carrier gas are supplied. During a second time period t2, the purge gas and the carrier gas are supplied. During a third time period t3, the polymer precursor of 1,4-phenylene diisocyanate (PDIC; $C_6H_2(CNO)_2$), that is, a second source gas, is supplied while the purge gas and the carrier gas are supplied. During a fourth time period t4, the purge gas and the carrier gas are supplied.

The purge gas and the carrier gas are continuously supplied from the first time period t1 to the fourth time period t4. The purge gas may not be supplied during the first time period t1 and the third time period t3, and may be supplied only during the second time period t2 and the fourth time period t4.

In this case, the first source gas and second source gas (or vapor) are generated and supplied to the reactor when a temperature of a substrate on which the thin film is deposited is under 100° C. or about 100° C., preferably about 40° C., a temperature of a PDIC source vessel is under 100° C. or about 100° C., preferably about 65° C., and a temperature of an EDA source vessel is under 100° C. or about 100° C., preferably about 30° C.

The thin film having a required thickness is deposited by repeating a first gas supply cycle, including the first time period t1 to the fourth time period t4, several times.

The second time period t2 and the fourth time period t4 are relatively longer than the first time period t1 and the third time period t3. For example, each of the first time period t1 and the third time period t3 may be about 1 second, and each of the second time period t2 and the fourth time period t4 may be about 5 seconds. Purge efficiency of a source gas having a high molecular weight may be increased by increasing a duration in which the first source gas is purged and the second source gas is purged as described above.

In the present exemplary embodiment, a thin film has been illustrated as being deposited using a thermal ALD method. In accordance with a method of depositing a thin film according to another exemplary embodiment, plasma may also be supplied during at least one of the first time period t1 in which the first source gas is supplied and the third time period t3 in which the second source gas is supplied.

The plasma may be supplied in an in-situ or remote manner, and UV may be supplied in pulse. By using plasma, the process can be done at relatively lower temperature, making it easier to control film quality and giving less damage to the polymer film which is susceptible to thermal energy, compared to the thermal ALD process.

Figure 2:
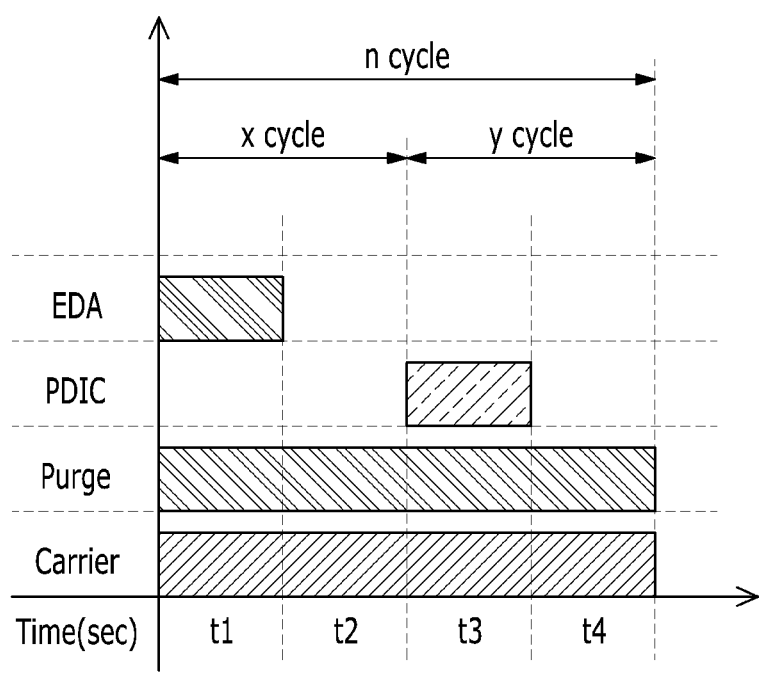
FIG. 2 is a diagram illustrating a gas supply cycle according to a method of depositing a thin film in accordance with an exemplary embodiment.

The method of depositing a thin film in accordance with another exemplary embodiment is described with reference to FIG. 2. FIG. 2 is a diagram illustrating a gas supply cycle according to a method of depositing a thin film in accordance with an exemplary embodiment.

Referring to FIG. 2, in the method of depositing a thin film in accordance with the present exemplary embodiment, a gas supply cycle "n cycle" is repeated several times, in which, after repeating a second gas supply cycle "x cycle" in which a polymer precursor of ethylenediamine (EDA; $C_2H_4(NH_2)_2$), that is, a first source gas, is supplied while supplying a purge gas and a carrier gas during a first time period t1 and the purge gas and the carrier gas are supplied during a second time period t2, a third gas supply cycle "y cycle" in which a polymer precursor of 1,4-phenylene diisocyanate (PDIC; $C_6H_2(CNO)_2$), that is, a second source gas, is supplied while supplying the purge gas and the carrier gas during a third time period t3, and the purge gas and carrier gas are supplied during a fourth time period t4.

The purge gas and the carrier gas are continuously supplied from the first time period t1 to the fourth time period t4. The purge gas may not be supplied during the first time period t1 and the third time period t3, but may be supplied during the second time period t2 and the fourth time period t4.

In this case, the first source gas and second source gas (or vapor) are generated and supplied to the reactor when a temperature of a substrate on which the thin film is deposited is under 100° C. or about 100° C., preferably about 40° C., a temperature of a PDIC source vessel is under 100° C. or about 100° C., preferably about 65° C., and a temperature of an EDA source vessel is under 100° C. or about 100° C., preferably about 30° C.

A thin film having a required thickness is deposited by repeating the gas supply cycle "n cycle" in which the second gas supply cycle "x cycle" including the first time period t1 and the second time period t2 is repeated several times and the third gas supply cycle "y cycle" including the third time period t3 and the fourth time period t4 is repeated several times.

The second time period t2 and the fourth time period t4 are relatively longer than the first time period t1 and the third time period t3. For example, each of the first time period t1 and the third time period t3 may be about 1 second, and each of the second time period t2 and the fourth time period t4 may be about 5 seconds. Purge efficiency of a source gas having a high molecular weight may be increased by increasing a duration in which the first source gas is purged and the second source gas is purged as described above.

In the present exemplary embodiment, a thin film has been illustrated as being deposited using a thermal ALD method. In accordance with a method of depositing a thin film according to another exemplary embodiment, plasma may also be supplied during at least one of the first time period t1 in which the first source gas is supplied and the third time period t3 in which the second source gas is supplied.

The plasma may be supplied in an in-situ or remote manner, and UV may be supplied in pulse.

In the deposition methods described with reference to FIGS. 1 and 2 in accordance with exemplary embodiments, PDIC and EDA have been used as polymer precursors. In a method of depositing a thin film in accordance with an exemplary embodiment, various polymer precursors listed in Table 1 below may be used.

TABLE 1

Figure 3:
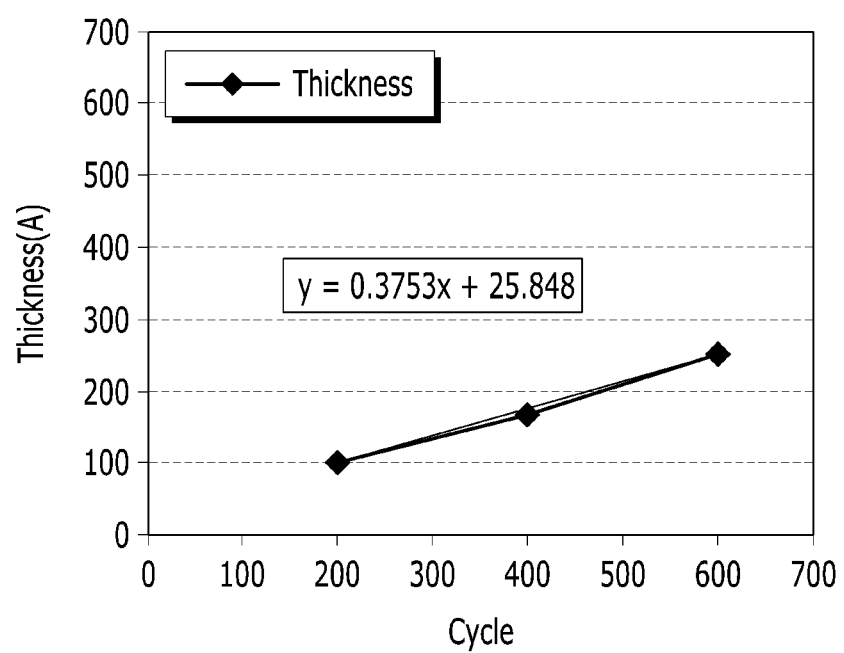
FIG. 3 is a graph illustrating the results of an experimental example.
Figure 4:
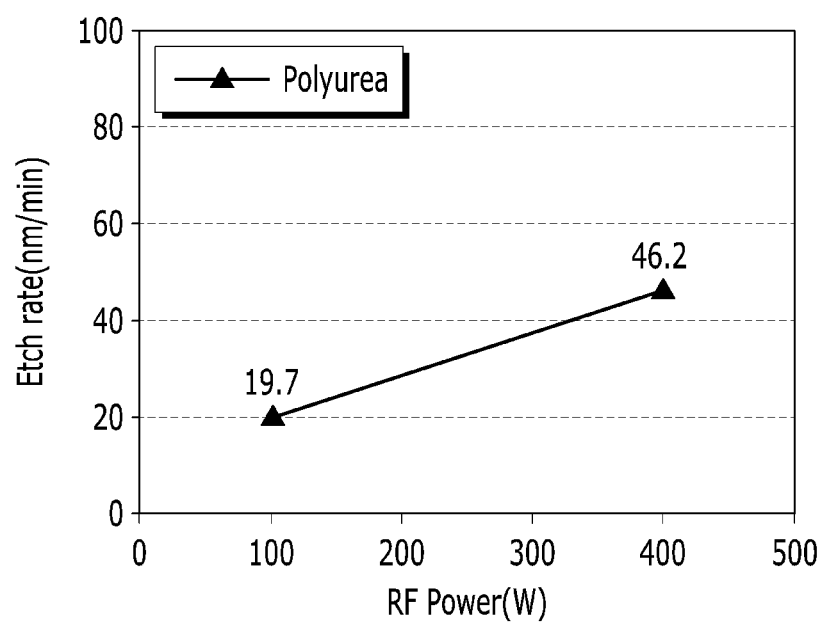
FIG. 4 is a graph illustrating the results of an experimental example.
Figure 6:
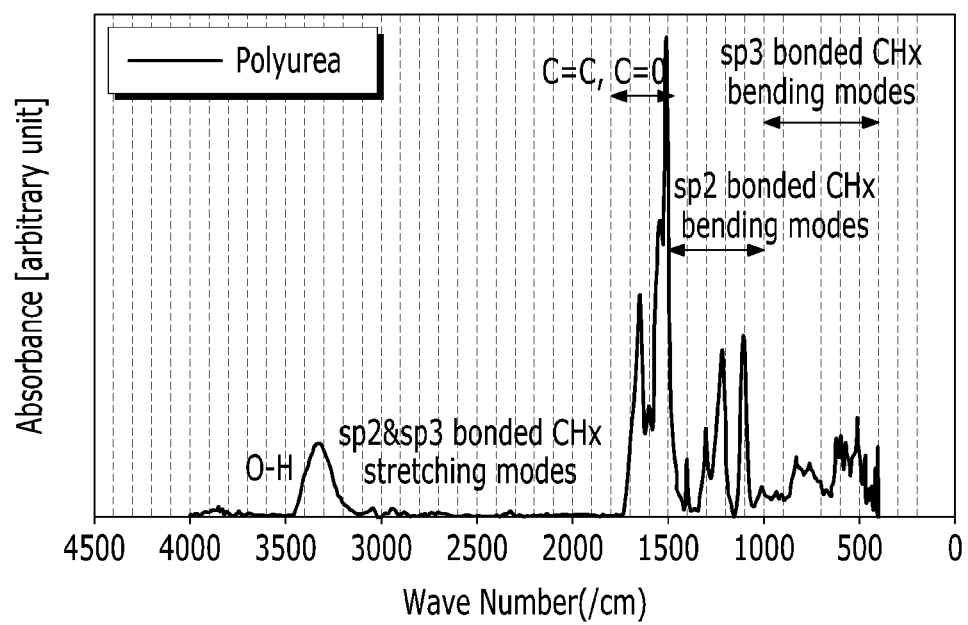
FIG. 6 is a graph illustrating the results of an experimental example.

Hexamethylene diamine $C_6H_{16}N_2$
Ethylenediamine $C_2H_4(NH_2)_2$
1,6-Diisocyanatohexane $C_8H_{12}N_2O_2$
1,4-phenylene diisocyanate $C_6H_2(CNO)_2$ The results of the deposition of a thin film according to the method of depositing a thin film in accordance with an exemplary embodiment are described with reference to FIGS. 3 to 6. FIG. 3 is a graph illustrating the results of an experimental example. FIG. 4 is a graph illustrating the results of an experimental example. FIG. 5 is a diagram illustrating the results of an experimental example. FIG. 6 is a graph illustrating the results of an experimental example.

First, the results of an experimental example of the present invention are described with reference to FIG. 3.

In the present experimental example, while the first gas supply cycle according to the method of depositing a thin film in accordance with an exemplary embodiment described with reference to FIG. 1 and the gas supply cycle according to the method of depositing a thin film in accordance with an exemplary embodiment described with reference to FIG. 2 were repeated, the thickness of a deposited thin film was measured, and the results thereof are illustrated in FIG. 3. From FIG. 3, it was found that the thickness of the thin film was linearly increased as the first gas supply cycle according to the method of depositing a thin film in accordance with an exemplary embodiment described with reference to FIG. 1 and the gas supply cycle according to the method of depositing a thin film in accordance with an exemplary embodiment described with reference to FIG. 2 were repeated. That is, it was found that the thin film was deposited properly so that the thickness of the thin film became thicker as the gas supply cycle was repeated if the thin film was deposited using the polymer precursors through an ALD method.

The results of an experimental example are described below with reference to FIG. 4.

In the present experimental example, after depositing a thin film by repeating the first gas supply cycle according to the method of depositing a thin film in accordance with an exemplary embodiment described with reference to FIG. 1 or repeating the gas supply cycle according to the method of depositing a thin film in accordance with an exemplary embodiment described with reference to FIG. 2 in an oxygen plasma atmosphere, the etch characteristics of the deposited thin film were measured, and the results thereof are illustrated in FIG. 4. The etch characteristics are etch characteristics according to oxygen radicals.

A polyurea film was deposited using the polymer precursors according to an ALD method, and a plasma etch characteristic according to the intensity of plasma was measured in an oxygen radical atmosphere with respect to deposited thin films.

From FIG. 4, it may be seen that an etch rate attributable to the oxygen radicals was increased as applied plasma power was increased. That is, it was found that the amount of the applied plasma power is constantly proportional to the etch rate attributable to the oxygen radicals.

The results of the experimental example are described below with reference to FIG. 5.

In the present experimental example, after depositing a thin film by repeating the first gas supply cycle according to the method of depositing a thin film in accordance with an exemplary embodiment described with reference to FIG. 1 or the gas supply cycle according to the method of depositing a thin film in accordance with an exemplary embodiment described with reference to FIG. 2, the refractive index "n" and absorption coefficient "k" of the deposited thin film were measured, and the results thereof are illustrated in FIG. 5.

The refractive index "n" and absorption coefficient "k" were measured in a non-visible light region and a visible light region.

From FIG. 5, it may be seen that the optical characteristics of the thin film deposited according to the method of depositing a thin film in accordance with an exemplary embodiment satisfied the criteria. In order to be used as an amorphous carbon layer, the refractive index "n" in the non-visible light region needs to be greater than 0.1 and the absorption coefficient "k" in the visible light region needs to be less than 0.1. More specifically, the refractive index "n" measured in a non-visible light wavelength region of 248 nm with respect to the thin film deposited using the deposition method in accordance with an exemplary embodiment was 1.72, which satisfies the criterion value of greater than 0.1. Furthermore, the absorption coefficient "k" measured in a visible light wavelength region of 633 nm with respect to the thin film deposited using the deposition method in accordance with an exemplary embodiment was 0.005, which satisfies the criterion value of less than 0.1.

The results of the experimental example are described below with reference to FIG. 6.

In the present experimental example, after depositing a thin film by repeating the first gas supply cycle according to the method of depositing a thin film in accordance with an exemplary embodiment described with reference to FIG. 1 or the gas supply cycle according to the method of depositing a thin film in accordance with an exemplary embodiment described with reference to FIG. 2, Fourier-transform infrared (FT-IR) spectroscopy was used for analysis, and the results thereof are illustrated in FIG. 6.

From FIG. 6, it may be seen that a carbon peak ($C=C$, $C=O$, CHx) appears in the FT-IR spectroscopy of the deposited thin film, and thus, the deposited thin film is an amorphous carbon layer.

As described above, in accordance with the method of depositing a thin film in accordance with an exemplary embodiment, an amorphous carbon layer can be deposited using the polymer precursors. Furthermore, the uniformity and step coverage of a thin film can be improved by depositing an amorphous carbon layer using the polymer precursors according to an ALD method.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of depositing a thin film, the method comprising:
   supplying a first source gas to a reactor during a first time period;
   supplying a purge gas to the reactor during a second time period;
   supplying a second source gas to the reactor during a third time period;
   supplying the purge gas to the reactor during a fourth time period; and
   supplying oxygen plasma in at least part of the first time period and the third time period,
   wherein the first source gas and the second source gas comprise polymer precursors,
   wherein the first source gas is one of hexamethylene diamine (C6H16N2) or ethylenediamine (C2H4(NH2)2) and the second source gas is one of 1,6-diisocyanatohexane (C8H12N2O2) or 1,4-phenylene diisocyanate (C6H2(CNO)2),
   wherein the first source gas and the second source gas are supplied at a temperature that is less than 100° C. or about 100° C., wherein the plasma is supplied at a substrate temperature that is less than 100° C. or about 100 C, wherein a polyurea film is deposited, and wherein applied plasma power is constantly proportional to the etch rate attributable to an oxygen radical.

2. The method of claim 1, wherein the first source gas comprises ethylenediamine (C2H4(NH2)2), and the second source gas comprises 1,4-phenylene diisocyanate (C6H2(CNO)2).

3. The method of claim 2, further comprising continuously supplying the purge gas from the first time period to the fourth time period.

4. The method of claim 2, further comprising repeating a first gas supply cycle comprising the first time period to the fourth time period a plurality of times.

5. The method of claim 2, wherein each of the second time period and the fourth time period is longer than each of the first time period and the third time period.

6. The method of claim 2, further comprising:

repeating a second gas supply cycle comprising the first time period and the second time period a plurality of times; and repeating a third gas supply cycle comprising the third time period and the fourth time period a plurality of times.

7. The method of claim 1, wherein each of the second time period and the fourth time period is longer than each of the first time period and the third time period.

* * * * *